United States Patent
Yim et al.

(10) Patent No.: US 9,448,437 B2
(45) Date of Patent: Sep. 20, 2016

(54) DISPLAY APPARATUS FOR CONTROLLING OPTICAL TRANSMISSIVITY

(71) Applicant: SAMSUNG DISPLAY CO., LTD., Yongin-si, Gyeonggi-do (KR)

(72) Inventors: Sang-Hoon Yim, Yongin-si (KR); Young-Woo Song, Yongin-si (KR); Jin-Koo Chung, Yongin-si (KR)

(73) Assignee: SAMSUNG DISPLAY CO., LTD., Yongin, Gyeonggi-do (KR)

(*) Notice: Subject to any disclaimer, the term of this patent is extended or adjusted under 35 U.S.C. 154(b) by 0 days.

(21) Appl. No.: 14/844,452

(22) Filed: Sep. 3, 2015

(65) Prior Publication Data

US 2015/0378201 A1    Dec. 31, 2015

Related U.S. Application Data

(63) Continuation of application No. 13/401,059, filed on Feb. 21, 2012, now Pat. No. 9,128,338.

(30) Foreign Application Priority Data

Jun. 27, 2011 (KR) ........................ 10-2011-0062489

(51) Int. Cl.
*G02F 1/13363* (2006.01)
*G02F 1/1362* (2006.01)
*H01L 51/52* (2006.01)
*G02F 1/1333* (2006.01)
*G02F 1/1335* (2006.01)
*G02F 1/1368* (2006.01)
*H01L 27/32* (2006.01)

(52) U.S. Cl.
CPC ......... *G02F 1/13363* (2013.01); *G02F 1/1362* (2013.01); *G02F 1/1368* (2013.01); *G02F 1/133345* (2013.01); *G02F 1/133528* (2013.01); *H01L 27/326* (2013.01); *H01L 51/5281* (2013.01); *G02F 2001/133531* (2013.01); *H01L 27/32* (2013.01)

(58) Field of Classification Search
CPC combination set(s) only.
See application file for complete search history.

(56) References Cited

U.S. PATENT DOCUMENTS 5,187,603 A    2/1993 Bos
2002/0171794 A1    11/2002 Nakamura et al.
(Continued)

FOREIGN PATENT DOCUMENTS

CN    1706198 A    12/2005
EP    2 337 078 A1 A1    6/2011
(Continued)

OTHER PUBLICATIONS

Extended European Search Report dated Jan. 28, 2014.
(Continued)

*Primary Examiner* — Wen-Ying P Chen
(74) *Attorney, Agent, or Firm* — Lee & Morse, P.C.

(57) ABSTRACT

A display apparatus includes a transparent display device, a first polarizer on a first surface of the transparent display device, a first retarder between the first polarizer and the first surface of the transparent display device, a second polarizer on a second surface of the transparent display device opposite the first surface, and a conversion retarder between the second polarizer and the second surface of the transparent display device, the conversion retarder being configured to delay a wavelength of the external light within a range from a first phase to a second phase and to transmit the wavelength-delayed light therethrough when power is supplied to the conversion retarder.

21 Claims, 11 Drawing Sheets

(56) References Cited

U.S. PATENT DOCUMENTS

| | | |
|---|---|---|
| 2003/0016324 A1 | 1/2003 | Jisaki et al. |
| 2004/0227698 A1 | 11/2004 | Yamazaki et al. |
| 2005/0024339 A1 | 2/2005 | Yamazaki et al. |
| 2005/0275339 A1 | 12/2005 | Seo et al. |
| 2006/0066785 A1 | 3/2006 | Moriya |
| 2007/0057932 A1 | 3/2007 | Shin et al. |
| 2009/0147185 A1 | 6/2009 | Quach |
| 2010/0182552 A1 | 7/2010 | Park et al. |
| 2011/0037683 A1 | 2/2011 | Park et al. |
| 2012/0268696 A1 | 10/2012 | Yim et al. |

FOREIGN PATENT DOCUMENTS

| | | |
|---|---|---|
| JP | 2000-131684 A | 5/2000 |
| JP | 2005-38608 A1 | 2/2005 |
| JP | 2005-250501 A | 9/2005 |
| JP | 2005-123241 A | 5/2006 |
| KR | 10-0719706 B1 | 5/2007 |
| KR | 10-2010-0085732 A | 7/2010 |
| KR | 10-2010-0137695 A | 12/2010 |

OTHER PUBLICATIONS

Japanese Office Action dated Mar. 1, 2016.
Chinese Office Action dated Jun. 3, 2016.

DISPLAY APPARATUS FOR CONTROLLING OPTICAL TRANSMISSIVITY

CROSS REFERENCE TO RELATED APPLICATION

This is a continuation application based on pending application Ser. No. 13/401,059, filed Feb. 21, 2012, the entire contents of which is hereby incorporated by reference.

BACKGROUND

1. Field

One or more aspects of example embodiments relate to display apparatuses, and more particularly, to a display apparatus that has an optical transmissivity controlled according to a mode.

2. Description of the Related Art

Organic light-emitting display apparatuses have larger viewing angles, better contrast characteristics, and faster response times, and consume less power than other display apparatuses. Thus, organic light-emitting display apparatuses have been used in various fields of application. For example, organic light-emitting display apparatuses have been used in personal mobile devices, e.g., MP3 players and mobile phones, and in TVs. An organic light-emitting display apparatus has self-light emitting characteristics, and its weight and thickness may be reduced because it does not require an additional light source, e.g., unlike a liquid crystal display (LCD) apparatus. Also, an organic light-emitting display apparatus may be manufactured to be a transparent display apparatus by including transparent thin-film transistors (TFTs) or transparent organic light-emitting diodes (OLEDs) therein and by forming a transmissive region (or a transmissive window) separate from a pixel region.

SUMMARY

One or more aspects of the example embodiments provide a display apparatus with optical devices on a transparent display device so as to control optical transmissivity according to a mode and with a small amount of power.

According to an aspect of the example embodiments, there is provided a display apparatus for controlling optical transmissivity, the display apparatus including a transparent display device, the transparent display device including a pixel divided into a first region for emitting light and a second region adjacent the first region for transmitting external light therethrough, a first polarizer on a first surface of the transparent display device, the first polarizer being configured to linearly polarize the external light and to transmit the linearly polarized light therethrough, a first retarder between the first polarizer and the first surface of the transparent display device, the first retarder being configured to delay a phase of the external light and to transmit the phase-delayed light therethrough, a second polarizer on a second surface of the transparent display device, the first and second surfaces of the transparent display device being opposite each other, and the second polarizer being configured to linearly polarize the external light and to transmit the linearly polarized light therethrough, and a conversion retarder between the second polarizer and the second surface of the transparent display device, the conversion retarder being configured to delay a wavelength of the external light within a range from a first phase to a second phase and to transmit the wavelength-delayed light therethrough when power is supplied to the conversion retarder.

The first polarizer and the second polarizer may have the same polarizing axis.

The first retarder may be configured to delay the wavelength of the external light by the first phase.

The conversion retarder may be configured to delay the wavelength of the external light by the first phase in accordance with the power supplied thereto, the first and second phases having a same absolute value but different directions, and the display apparatus being configured to block transmittance of external light therethrough.

The conversion retarder may be configured to delay the wavelength of the external light by the second phase in accordance with the power supplied thereto, the first and second phases having a same absolute value but different directions, and the display apparatus being configured to transmit external light therethrough.

The first polarizer and the second polarizer may have polarizing axes that are perpendicular to each other.

The first retarder may be configured to delay the wavelength of the external light by the first phase.

The conversion retarder may be configured to delay the wavelength of the external light by the first phase in accordance with the power supplied thereto, the first and second phases having a same absolute value but different directions, and the display apparatus being configured to transmit external light therethrough.

The conversion retarder may be configured to delay the wavelength of the external light by the second phase in accordance with the power supplied thereto, the first and second phases having a same absolute value but different directions, and the display apparatus being configured to block transmittance of external light therethrough.

The conversion retarder may include a second retarder and a liquid crystal layer, the second retarder being between the transparent display device and the liquid crystal layer, the liquid crystal layer being between the second retarder and the second polarizer, and the liquid crystal layer being configured to delay the wavelength of the external light within the predetermined range in accordance with voltage applied thereto.

The first polarizer and the second polarizer may have the same polarizing axis, the first retarder being configured to delay the wavelength of the external light by the first phase.

The second retarder may be configured to delay the wavelength of the external light by the second phase, the liquid crystal layer may be configured to delay the wavelength of the external light within a range from a third phase to a fourth phase when voltage is applied to the liquid crystal layer, a sum of the third phase and the fourth phase may be equal to the fourth phase, a sum of the fourth phase and the second phase may be equal to the first phase, and the first phase and the second phase may have a same absolute value but different directions.

The second retarder may be configured to delay the wavelength of the external light by the first phase, the liquid crystal layer may be configured to delay the wavelength of the external light within a range from a fifth phase to a sixth phase when voltage is applied to the liquid crystal layer, a sum of the fifth phase and the first phase may be equal to the second phase, a sum of the sixth phase and the first phase may be equal to the first phase, and the first phase and the second phase may have a same absolute value but different directions.

The first polarizer and the second polarizer may have polarizing axes perpendicular to each other, the first retarder being configured to delay the wavelength of the external light by the first phase.

The pixel may include a pixel circuit unit in the first region and including at least one thin-film transistor (TFT), a first insulating layer covering at least the pixel circuit unit, a second electrode on the first insulating layer to be electrically connected to the pixel circuit unit, the second electrode being located in the first region, a second electrode in at least the first region of the pixel and facing the first electrode, and an organic layer between the first electrode and the second electrode, the organic layer including an emission layer.

The second electrode may include a first aperture in a location thereof corresponding to the second region.

The display apparatus may further include a plurality of second insulating layers at a location corresponding to the second region. Each of the plurality of second insulating layers may include a second aperture in a location corresponding to at least a portion of the second region.

The first insulating layer and the plurality of second insulating layers may be formed of a transparent material.

The first electrode may be an optical transmissive electrode, and may overlap with the pixel circuit unit to cover the pixel circuit unit.

The first electrode may be an optical reflective electrode, and does not overlap with the pixel circuit unit not to cover the pixel circuit unit.

The conversion retarder may be a switchable retarder having at least two different phase states.

The first retarder and the conversion retarder may include different materials.

The conversion retarder may include liquid crystals.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
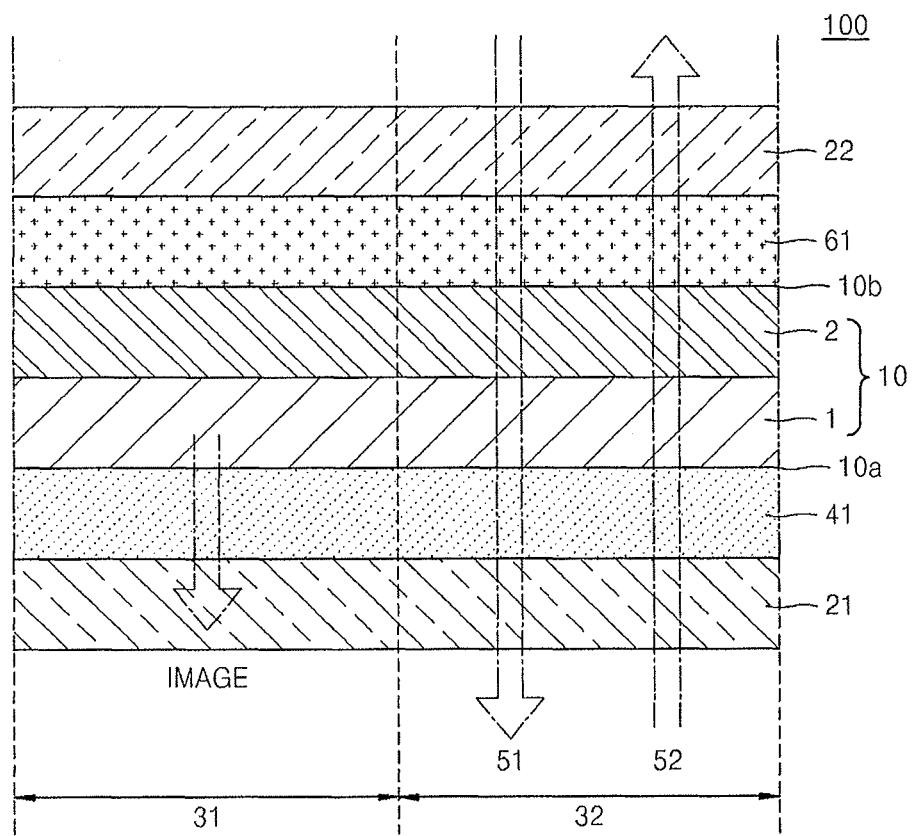
FIG. 1 illustrates a schematic cross-sectional view of a display apparatus according to an embodiment.

Korean Patent Application No. 10-2011-0062489, filed on Jun. 27, 2011, in the Korean Intellectual Property Office, and entitled: "DISPLAY APPARATUS FOR CONTROLLING OPTICAL TRANSMISSIVITY," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer (or element) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

While such terms as "first," "second," etc., may be used to describe various components, such components must not be limited to the above terms. The above terms are used only to distinguish one component from another.

The terms used in the present specification are merely used to describe exemplary embodiments, and are not intended to limit the example embodiments. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

FIG. 1 is a schematic cross-sectional view of a display apparatus 100 according to an embodiment. Referring to FIG. 1, the display apparatus 100 may include a first polarizer 21, a first retarder 41, a conversion retarder 61, and a second polarizer 22 on a transparent display device 10 that transmits external light therethrough.

The transparent display device 10 may be a light-emitting display device that is a bottom emission type display device, and may include a first substrate 1, a display unit disposed on the first substrate 1, and a second substrate 2 that seals the display unit. The display unit is divided into a plurality of pixels, and each pixel includes a pixel region 31, i.e., a region for emitting light and displaying an image toward the first substrate 1, and a transmissive region 32, i.e., a region disposed adjacent to the pixel region 31 and transmitting external light therethrough.

The first retarder 41 and the first polarizer 21 may be, e.g., sequentially, disposed at an external side, i.e., a first surface 10a, of the first substrate 1 of the transparent display device 10, i.e., a side via which light is emitted from the transparent display device 10. A combination of the first polarizer 21 and the first retarder 41 allows circularly polarized light, which circulates in a certain direction, to pass therethrough. In other words, a combination of the first polarizer 21 and the first retarder 41 allows only one from among left circularly polarized light and right circularly polarized light to pass therethrough, so that reflection of external light from a front surface of the display apparatus 100 may be minimized, thereby allowing a user to view a clearer image. Here, the first polarizer 21 is a linear polarizer that linearly polarizes incident light in a certain direction, and the first retarder 41 is a switchable retarder that phase-delays incident light by +¼ wavelength (+λ/4).

The conversion retarder 61 and the second polarizer 22 may be, e.g., sequentially, disposed an external side, i.e., a second surface 10*b*, of the second substrate 2 of the transparent display device 10, i.e., a side through which light is not emitted from the transparent display device 10. That is, the display device 10 may be between the first retarder 41 and the conversion retarder 61. For example, the first retarder 41, the first substrate 1, the second substrate 2, and the conversion retarder 61 may be sequentially stacked on the first polarizer 21. Here, the second polarizer 22 is a linear polarizer that linearly polarizes incident light in a certain direction.

According to one embodiment of the example embodiments, in the display apparatus 100, the first polarizer 21 and the second polarizer 22 may have the same polarizing axis. According to another embodiment of the example embodiments, the first polarizer 21 and the second polarizer 22 may have different polarizing axes.

The conversion retarder 61 is a switchable retarder that phase-delays incident light within a range from a (−¼) wavelength (−λ/4) to a (+¼) wavelength +(λ/4), and may change a phase-delayed value. The conversion retarder 61 may delay the phase of incident light according to a mode, e.g., a mode change may occur according to a voltage or power applied thereto. For example, the conversion retarder 61 may be formed of liquid crystals, i.e., the liquid crystals may be arranged according to an applied electric field, or of an electrochromic material, i.e., the state of an electrochromic material may change according to power supplied thereto. For example, when the conversion retarder 61 is formed of liquid crystals, because the liquid crystals react to a voltage difference, an even phase difference may be obtained in the entire area of the liquid crystals and the liquid crystals may be operated with a small amount of power. In addition, a conversion retarder 61 formed of liquid crystals may be inexpensive.

The conversion retarder 61 of the display apparatus 100 according to example embodiments may facilitate adjustment of transmissivity of external light with a small amount of power. That is, a phase-delayed value of the conversion retarder 61 may be controlled to adjust transmissivity with relatively low power consumption, as will be described in more detail below.

In general, transparent display apparatuses (or transparent display devices) have a fixed transmissivity with respect to external light, and thus, a user cannot adjust the transmissivity thereof to a desired level. While optical transmissivity may be potentially adjusted with an external controller, e.g., with a shutter installed at an outer side of the transparent display device, use of the shutter may cause large power consumption and reduced overall transmissivity of the transparent display device. For example, since the shutter includes various devices, e.g., electrodes, at least one optical film, and at least one substrate, the reduced transmissivity of the transparent display device may be relatively large, e.g., the shutter may have a transmissivity of only about 5% even in a mode for transmitting light. In other words, when a shutter is installed at an outer side of a transparent display device to control the transmissivity of the transparent display device, the overall transmissivity of the display device may be sharply reduced due to the shutter, thereby preventing the transparent display device from normal operation.

However, according to example embodiments, the conversion retarder 61, together with other optical members, i.e., with the first retarder 41 and the first/second polarizers 21/22, may control phase-delayed values according to a mode. Thus, the transmissivity of the display device 10 may be controlled with a small amount of power, without having to use a high-power consuming optical transmissivity controller, e.g., without using a shutter. It is further noted that the optical members, e.g., polarizers and retarders, of the display apparatus 100 provide no substantial reduction of the overall transmissivity of the display device 10, e.g., unlike the shutter, thereby enabling the display apparatus 100 to perform normal operation in the transparent mode.

According to an embodiment, if the display apparatus 100 operates in the transparent mode, a user may see through the display apparatus 100. That is, a user, at a side where an image is displayed, may view objects at an external side of the second substrate 2 by using first external light 51 transmitted in a direction from the external side of the second substrate 2 to the external side of the first substrate 1. Also, a user, at a side opposite to the side where an image is displayed, may also view an object displayed at the external side of the first substrate 1 by using second external light 52 transmitted in a direction from the external side of the first substrate 1 to the external side of the second substrate 2. The first external light 51 is transmitted in a direction in which the image is displayed, and the second external light 52 is transmitted in a direction opposite to the direction of the first external light 51.

If the display apparatus 100 operates in a black mode (or block mode) for blocking light, then a user cannot view through the display apparatus 100. That is, a user at the side where an image is displayed cannot view an object at the external side of the second substrate 2. Also, a user at the side opposite to the side where an image is displayed cannot view an object at the external side of the first substrate 1. Driving of the display apparatus 100 in various modes, i.e., in the transparent and black modes, will be described in detail below with reference to FIGS. 9 to 12.

Figure 2:
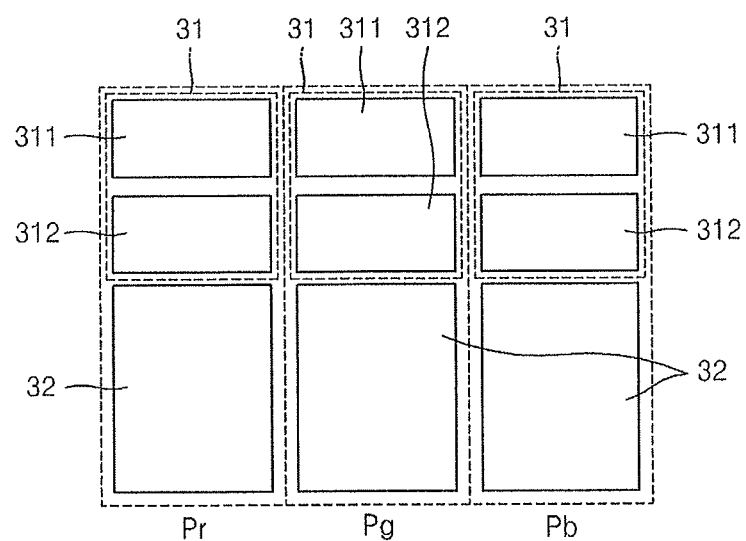
FIG. 2 illustrates a pixel included in the display apparatus of FIG. 1 according to an embodiment.
Figure 3:
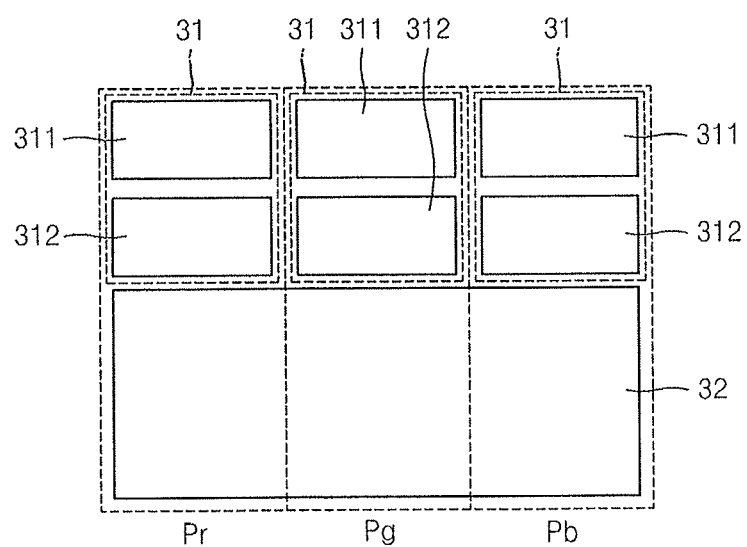
FIG. 3 illustrates a pixel included in the display apparatus of FIG. 1 according to another embodiment.

FIG. 2 illustrates a pixel included in the transparent display device 10 of FIG. 1 according to an embodiment, and FIG. 3 illustrates a pixel included in the transparent display device 10 of FIG. 1 according to another embodiment. Referring to FIGS. 2 and 3, the pixel may include a plurality of sub pixels, e.g., a red sub pixel Pr, a green sub pixel Pg, and a blue sub pixel Pb.

Each of the red, green, and blue sub pixels Pr, Pg, and Pb includes the pixel region 31 and the transmissive region 32. In the pixel region 31, a pixel circuit unit 311 and a light-emitting unit 312 may be disposed adjacent to each other not to overlap with each other, so that an optical path may not be blocked by the pixel circuit unit 311 when bottom emission occurs in the light-emitting unit 312 toward the first substrate 1. The transmissive region 32 that transmits external light therethrough may be disposed adjacent to the pixel region 31. The transmissive regions 32 may be disposed to respectively correspond to the red, green, and blue sub pixels Pr, Pg, and Pb to be spaced apart from each other, e.g., as illustrated in FIG. 2, or to be connected to each other, e.g., as illustrated in FIG. 3. In other words, in the entire region of the display unit, the pixel may include a plurality of pixel regions 31 that are disposed apart from each other between common transmissive regions 32.

The area of the transmissive regions 32 that transmit external light therethrough in the embodiment of FIG. 3 may be larger than that in the embodiment of FIG. 2, thereby increasing the overall transmissivity of the display unit. Although FIG. 3 illustrates that all the transmissive regions 32 corresponding to the red sub pixel Pr, the green sub pixel Pg, and the blue sub pixel Pb are connected to each other, example embodiments are not limited thereto, e.g., the transmissive regions 32 corresponding to two adjacent sub pixels from among the red sub pixel Pr, the green sub pixel Pg, and the blue sub pixel Pb may be connected to each other.

Figure 4:
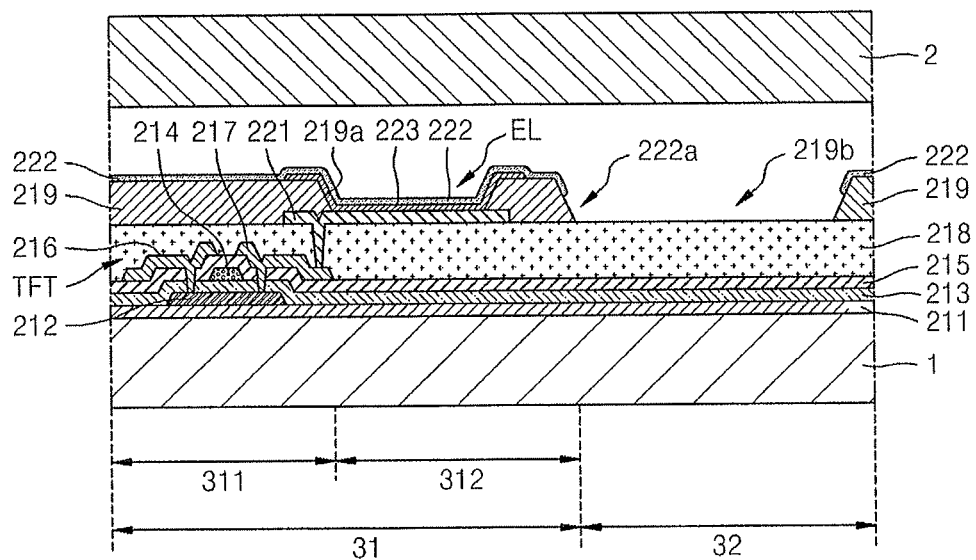
FIG. 4 illustrates a cross-sectional view of a sub pixel in FIG. 2 or FIG. 3.

FIG. 4 is a cross-sectional view of one of the red, green, and blue sub pixels Pr, Pg, and Pb illustrated in FIG. 2 or FIG. 3. As illustrated in FIG. 4, in a pixel circuit unit 311 of the pixel region 31, a thin-film transistor (TFT) may be disposed, but example embodiments are not limited thereto, e.g., a pixel circuit including the TFT may be disposed. The pixel circuit unit 311 may further include a plurality of TFTs and a storage capacitor. Also, the pixel circuit unit 311 may further include a scan line, a data line, and a Vdd line connected to the plurality of TFTs and the storage capacitor. In the light-emitting unit 312 of the pixel region 31, an organic emission device EL that is a light-emitting device may be disposed. The organic emission device EL may be electrically connected to the TFT of the pixel circuit unit 311.

In detail, a buffer layer 211 may be formed on a first substrate 1, and the pixel circuit including the TFT may be formed on the buffer layer 211. A semiconductor active layer 212 may be formed on the buffer layer 211.

The buffer layer 211 protects the substrate 1 from impurities and planarizes a surface of the substrate 1. The buffer layer 211 may be formed of any of various materials that can perform the functions described above. For example, the buffer layer 21 may be formed of an inorganic material, e.g., a silicon oxide, a silicon nitride, a silicon oxynitride, an aluminum oxide, an aluminum nitride, a titanium oxide, or a titanium nitride, and/or an organic material, e.g., polyimide, polyester, or acryl. The buffer layer 211 is not an essential element and thus may not be formed.

The semiconductor active layer 212 may be formed of polycrystal silicon, but is not limited thereto, e.g., may be formed of a semiconductor oxide. For example, the semiconductor active layer 212 may be a G-I-Z-O layer [$(In_2O_3)_a(Ga_2O_3)_b(ZnO)_c$ layer], where a, b, and c are integers that respectively satisfy $a \geq 0$, $b \geq 0$, and $c > 0$. When the semiconductor active layer 212 is formed of a semiconductor oxide, the transmissivity of the pixel circuit unit 311 of the pixel region 31 may be improved, thereby increasing the overall transmissivity of the display unit.

A gate insulating layer 213 may be formed on the buffer layer 211 to cover the semiconductor active layer 212, and a gate electrode 214 may be formed on the gate insulating layer 213. An interlayer insulating layer 215 may be formed on the gate insulating layer 213 to cover the gate electrode 214. A source electrode 216 and a drain electrode 217 may be formed on the interlayer insulating layer 215 to contact the semiconductor active layer 212 through contact holes, respectively. The structure of the TFT is not limited to the above description and any type of TFT may be employed.

A passivation layer 218 may be formed to cover the TFT. The passivation layer 218 may be a single insulating layer or a plurality of insulating layers, an upper surface of which is planarized. The passivation layer 218 may be formed of an inorganic material and/or an organic material. The passivation layer 218 may be formed to cover both the pixel region 31 and the transmissive region 32, e.g., as illustrated in FIG. 4, but is not limited thereto. Although not shown, an aperture (not shown) may be formed in a portion of the passivation layer 218 that corresponds to the transmissive region 32, so that the efficiency of the transmissive region 32 that transmits external light therethrough may be improved.

Referring to FIG. 4, a first electrode 221 of the organic emission device EL to be electrically connected to the TFT may be formed on the passivation layer 218 to be electrically connected to the TFT. A plurality of the first electrodes 221 may be disposed in an island pattern independently in units of sub pixels. The first electrode 221 may be disposed in the light-emitting unit 312 of the pixel region 31 not to overlap with the pixel circuit unit 311.

A pixel-defining layer 219, formed of an organic material and/or an inorganic material, may be formed on the passivation layer 218. The pixel-defining layer 219 may include a third aperture 219a, e.g., so edges of the first electrode 221 are covered by the pixel-defining layer 219 and a central part of the first electrode 221 is exposed. The pixel-defining layer 219 may cover the pixel region 31 but is not limited thereto, e.g., the pixel-defining layer 219 may cover at least a portion of the pixel region 31, e.g., edges of the first electrode 221. A second aperture 219b may be formed in a portion of the pixel-defining layer 219 corresponding to the transmissive region 32, as illustrated in FIG. 4. If the pixel-defining layer 219 is not disposed in the transmissive region 32, the efficiency of the transmissive region 32 that transmits external light therethough may be improved.

Both the passivation layer 218 and the pixel-defining layer 219 may be formed of a transparent material. In this case, because insulating layers, e.g., the passivation layer 218 and the pixel-defining layer 219, are formed of a transparent material, the efficiency of the transparent display device 10 that transmits external light therethough may be improved.

An organic layer 223 and a second electrode 222 may be sequentially disposed on the first electrode 221 exposed via the third aperture 219a. The second electrode 222 may be disposed in pixel region 31 to face the first electrode 221 and cover the organic layer 223 and the pixel-defining layer 219. The second electrode 222 may be formed at least in the pixel region 31, and may include a first aperture 222a in a portion thereof corresponding to the transmissive region 32, as illustrated in FIG. 4. If the second electrode 222 is not disposed in the transmissive region 32, the efficiency of the transmissive region 32 that transmits external light therethrough may be improved. The first aperture 222a and the second aperture 219b may be connected to each other.

The organic layer 223 may be a low molecular weight organic layer or a polymer organic layer. If the organic layer 223 is a low molecular weight organic layer, the organic layer 223 may be formed by stacking a hole injection layer (HIL), a hole transport layer (HTL), an emission layer (EML), an electron transport layer (ETL), and an electron injection layer (EIL) in a single structure or a composite structure. In this case, the organic layer 223 may be formed of any of various organic materials, e.g., copper phthalocyanine (CuPc), N,N'-Di(naphthalene-1-yl)-N,N'-diphenyl-benzidine (NPB), or tris-8-hydroxyquinoline aluminum (Alq3). The low-molecular weight organic layer may be formed, e.g., by vacuum deposition. In this case, the HIL, the HTL, the ETL, and the EIL may be common layers to red, green, and blue pixels.

The first electrode 221 may function as an anode and the second electrode 222 may function as a cathode, or vice versa. According to an embodiment, the first electrode 221 may be a transparent electrode and the second electrode 222 may be a reflective electrode. For example, the first electrode 221 may be formed of a transparent conductive material, e.g., ITO, IZO, ZnO, $In_2O_3$, or the like, and the second electrode 222 may be formed of, e.g., Ag, Mg, Al, Pt, Pd, Au, Ni, Nd, Ir, Cr, Li, Ca, or the like. Thus, the organic emission device EL may be a bottom emission type device, in which an image is displayed toward the first electrode 221. In this case, the second electrode 222 may be formed to an appropriate thickness sufficient not to cause a voltage drop to occur in the entire display unit. Accordingly, it may be possible to manufacture the display apparatus 100 in a large scale.

Figure 5:
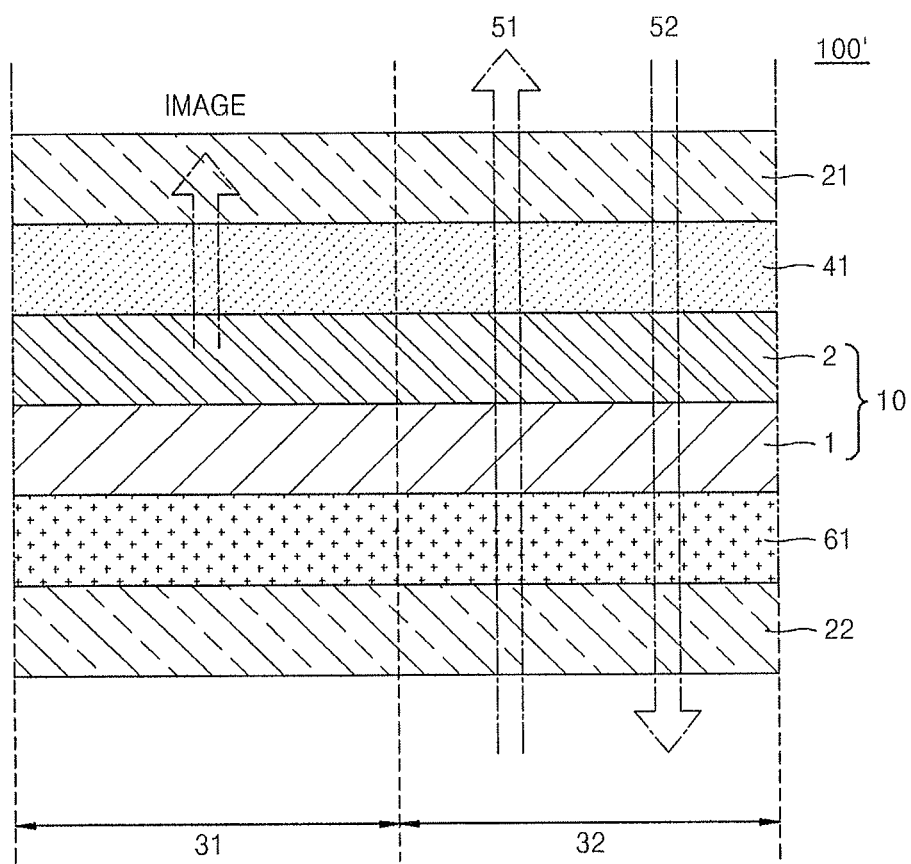
FIG. 5 illustrates a schematic cross-sectional view of a display apparatus according to another embodiment.

FIG. 5 is a schematic cross-sectional view of a display apparatus 100' according to another embodiment. The display apparatus 100' illustrated in FIG. 5 may be a light-emitting display apparatus in which a transparent display device 10 is a top emission type display device, unlike in the display apparatus 100 of FIG. 1. The display apparatus 100' may include the first retarder 41 and the first polarizer 21 sequentially disposed on the second substrate 2 of the transparent display device 10, and the conversion retarder 61 and the second polarizer 22 sequentially disposed the first substrate 1 of the transparent display device 10. As opposed to the display apparatus 100 of FIG. 1, the display apparatus 100' includes an image displayed on the external side of the second substrate 2 of the transparent display device 10. Other elements of the display apparatus 100' are substantially the same as those of the display apparatus 100 of FIG. 1 in terms of their functions and, thus, will not described again.

Figure 6:
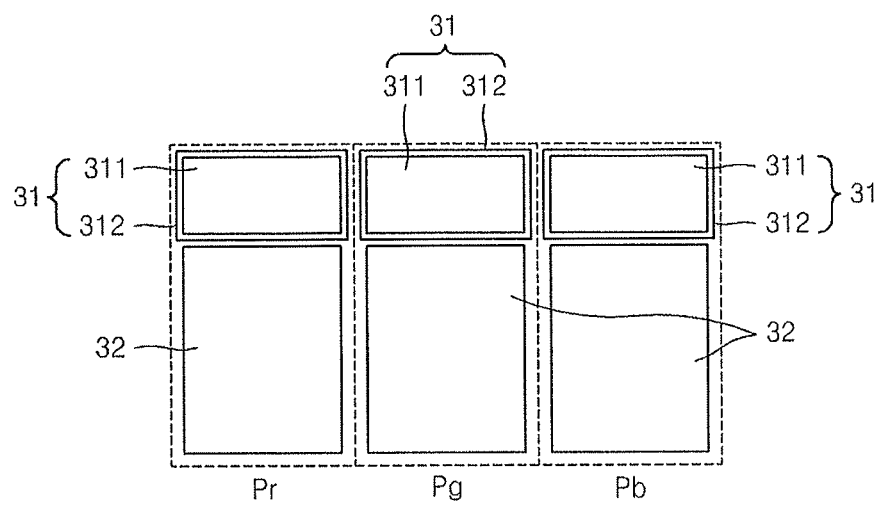
FIG. 6 illustrates a pixel in the display apparatus of FIG. 5 according to an embodiment.
Figure 7:
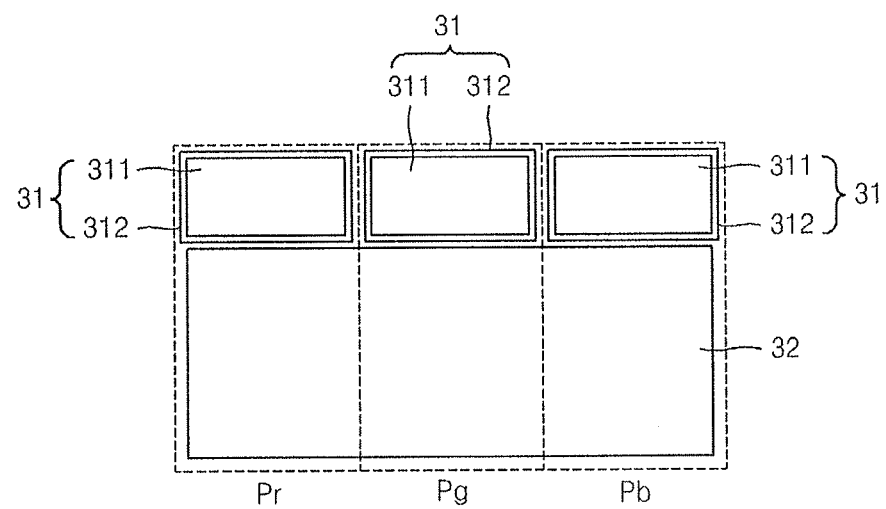
FIG. 7 illustrates a pixel in the display apparatus of FIG. 5 according to another embodiment.

FIG. 6 illustrates a pixel included in the transparent display device 10 of FIG. 5 according to another embodiment. FIG. 7 illustrates a pixel included in the transparent display device 10 of FIG. 5 according to another embodiment.

Referring to FIGS. 6 and 7, the pixel includes a pixel circuit unit 311 and a light-emitting unit 312 disposed to overlap with each other, unlike in the pixel illustrated in FIGS. 2 and 3. Because a top emission occurs in the light-emitting unit 312 toward the second substrate 2, the pixel circuit unit 311 and the light-emitting unit 312 may overlap with each other. In addition, because the pixel circuit unit 311 including a pixel circuit (not shown) is covered by the light-emitting unit 312, it may be possible to prevent optical interference caused by the pixel circuit. Other elements of the display apparatus 100' are substantially the same as those of the display apparatus 100 of FIG. 2 or 3 in terms of their functions and, thus, will not described again. It is noted that the transmissive regions 32 may be disposed to respectively correspond to a plurality of sub pixels Pr, Pg, and Pb to be apart from each other, e.g., as illustrated in FIG. 6, or may be connected to each other, e.g., as illustrated in FIG. 7.

Figure 8:
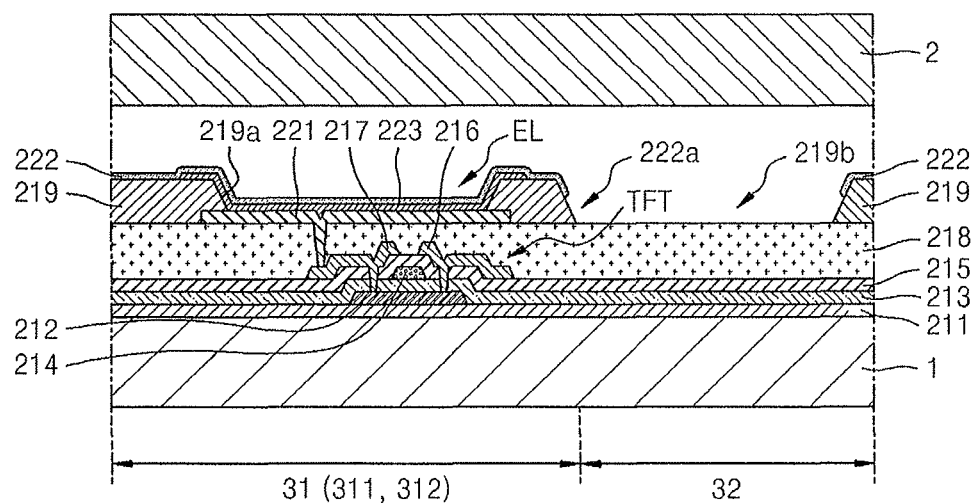
FIG. 8 illustrates a cross-sectional view of a sub pixel in FIG. 6 or FIG. 7.

FIG. 8 is a cross-sectional view of one of the red, green, and blue sub pixels Pr, Pg, and Pb illustrated in FIG. 6 or 7. Referring to FIG. 8, a TFT may be disposed in the pixel circuit unit 311, and an organic emission device EL, which is a light-emitting device, may be disposed in the light-emitting unit 312'.

In detail, the buffer layer 211 may be formed on the first substrate 1, the semiconductor active layer 212 may be formed on the buffer layer 211, and the gate insulating layer 213, the gate electrode 214, and the interlayer insulating layer 215 may be formed on the semiconductor active layer 212. The source electrode 216 and the drain electrode 217 may be formed on the interlayer insulating layer 215. The passivation layer 218, which is a type of insulating layer, may be formed to cover the TFT. The passivation layer 218 may cover both the pixel region 31 and the transmissive region 32, as illustrated in FIG. 8, but is not limited thereto. The passivation layer 218 may include an aperture (not shown) in a portion thereof corresponding to the transmissive region 32, thereby improving the efficiency of the transmissive region 32 that transmits external light therethrough.

Referring to FIG. 8, a first electrode 221 of the organic emission device EL electrically connected to the TFT may be disposed on the passivation layer 218. The first electrode 221 may be disposed in the light-emitting unit 312 included in the pixel region 31, and may overlap the pixel circuit unit 311 so as to cover the pixel circuit unit 311, e.g., the first electrode 221 may be disposed in the pixel region 31.

A pixel-defining layer 219 formed of an organic material and/or an inorganic material, may be disposed on the passivation layer 218. The pixel-defining layer 219 may include the third aperture 219a therein in such a manner that edges of the first electrode 221 may be covered by the pixel-defining layer 219 and a central part of the first electrode 221 is exposed. The pixel-defining layer 219 may cover the pixel region 31 but is not limited thereto, e.g., may cover at least a portion of the pixel region 31, e.g., edges of the first electrode 221. The second aperture 219b may be formed in the portion of the pixel-defining layer 219 corresponding to the transmissive region 32, as illustrated in FIG. 8. If the pixel-defining layer 219 is not disposed in the transmissive region 32, the efficiency of the transmissive region 32 that transmits external light therethough may be improved.

Both the passivation layer 218 and the pixel-defining layer 219 may be formed of a transparent material. In this case, because insulating layers, e.g., the passivation layer 218 and the pixel-defining layer 219, are formed of a transparent material, the efficiency of the transparent display device 10 that transmits external light therethough may be improved.

An organic layer 223 and a second electrode 222 may be sequentially disposed on the first electrode 221 exposed via the third aperture 219a. The second electrode 222 may be formed at least in the pixel region 31, and may include a first aperture 222a in a portion thereof corresponding to the transmissive region 32, as illustrated in FIG. 8. If the second electrode 222 is not disposed in the transmissive region 32, the efficiency of the transmissive region 32 that transmits external light therethrough may be improved. The first aperture 222a and the second aperture 219b may be connected to each other.

In the embodiment of FIG. 8, the first electrode 221 may have a stacked structure of a transparent conductor and a reflective layer, and the second electrode 222 may be a semi-transparent and semi-reflective electrode. The transparent conductor may be formed of an oxide having a relatively high work function, e.g., ITO, IZO, ZnO, or $In_2O_3$. The reflective layer may be formed of at least one of, e.g., Ag, Mg, Al, Pt, Pd, Au, Ni, Nd, Ir, Cr, Li, Ca, Mo, and an alloy thereof.

The second electrode 222 may be formed of at least one of, e.g., Ag, Mg, Al, Pt, Pd, Au, Ni, Nd, Ir, Cr, Li, Ca, Mo, and an alloy thereof. The second electrode 222 may be formed of a thin film having a thickness between about 100 Å to about 300 Å, so that the transmissivity thereof may be improved. Accordingly, the organic emission device EL is a top emission type device, in which an image is displayed toward the second electrode 222.

FIGS. 9 to 12 illustrate driving of the display apparatuses 100 and 100' in accordance with a predetermined mode, according to example embodiments. For example, each of the display apparatuses 100 and 100' may include two modes classified according to the intensity of light transmitted through the display apparatus in accordance with a phase-delayed value of the conversion retarder 61. Hereinafter, for convenience only, it is assumed that the conversion retarder 61 is formed of liquid crystals. The phase-delayed value of the conversion retarder 61 may be determined by the level of power or voltage applied to the conversion retarder 61. The transmissivities of external light incident on the display apparatus in the two modes classified according to a phase-delayed value of the conversion retarder 61 will now be described. The embodiments of FIGS. 9 to 12 may be classified into embodiments of FIGS. 9 and 10, i.e., embodiments including polarizers with same polarizing axes but different transmissivity modes, and embodiments of FIGS. 11 and 12, i.e., embodiments including polarizers with different polarizing axes and different transmissivity modes.

Figure 9:
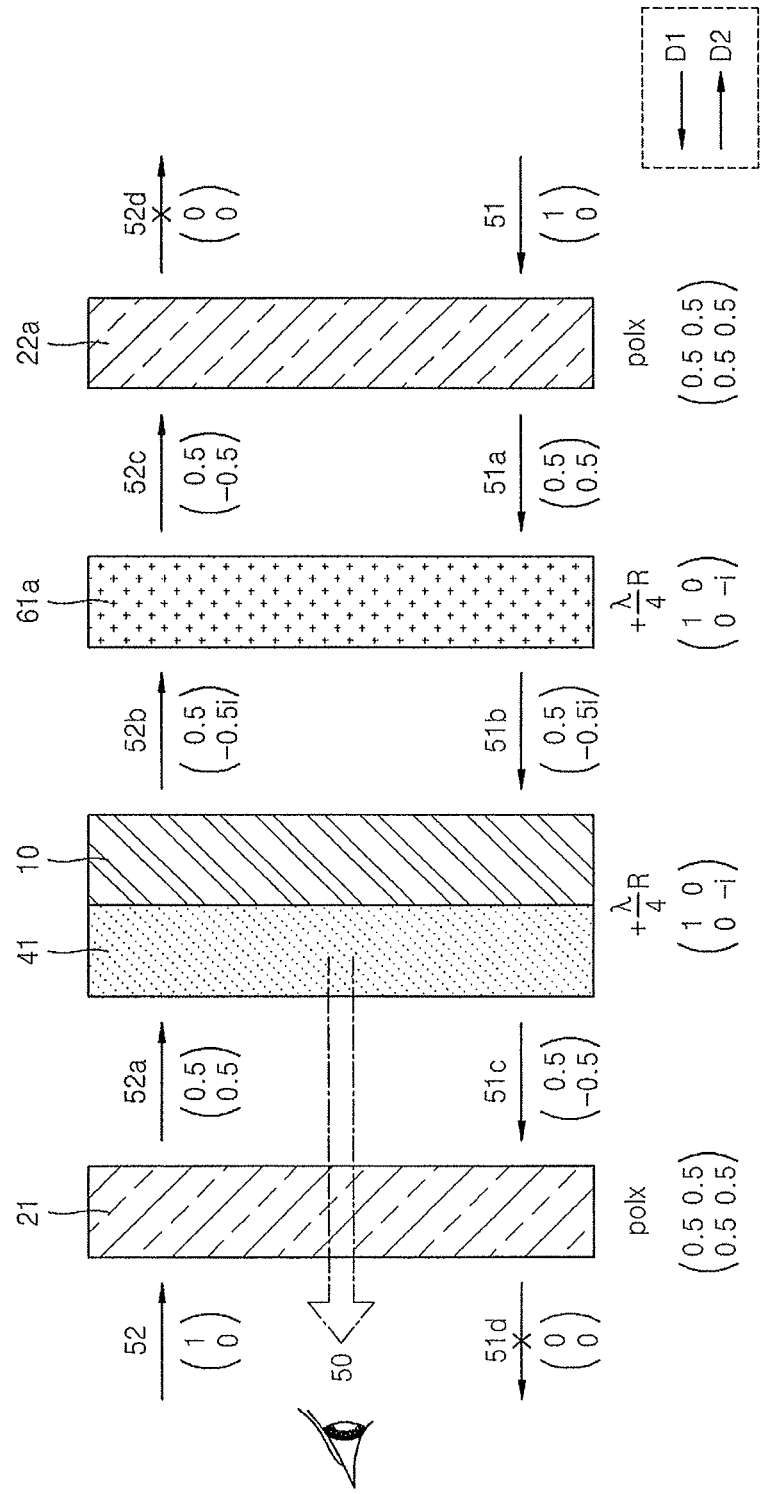
FIGS. 9 to 12 illustrate driving of a display apparatus according to embodiments.
Figure 10:
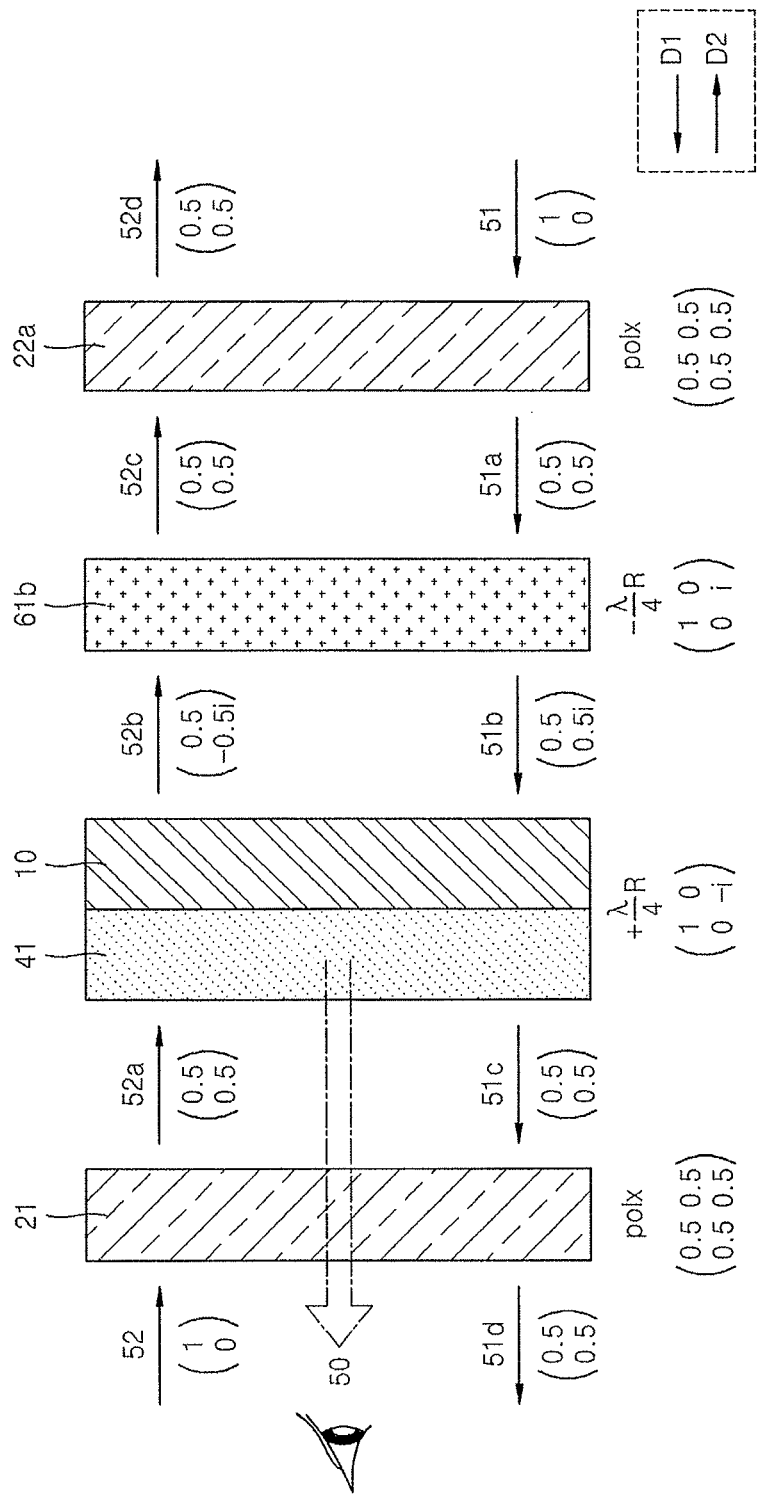
Figure 11:
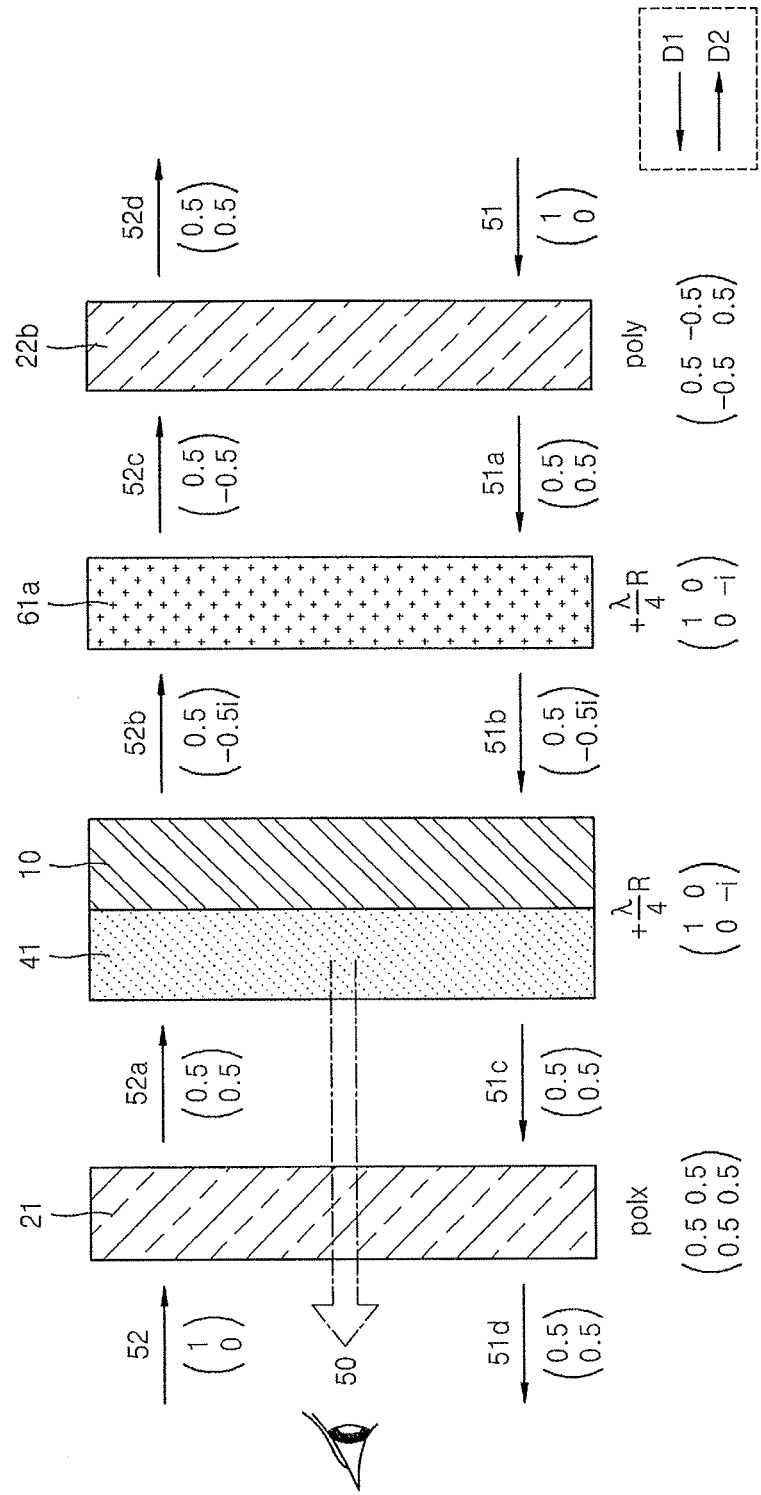
Figure 12:
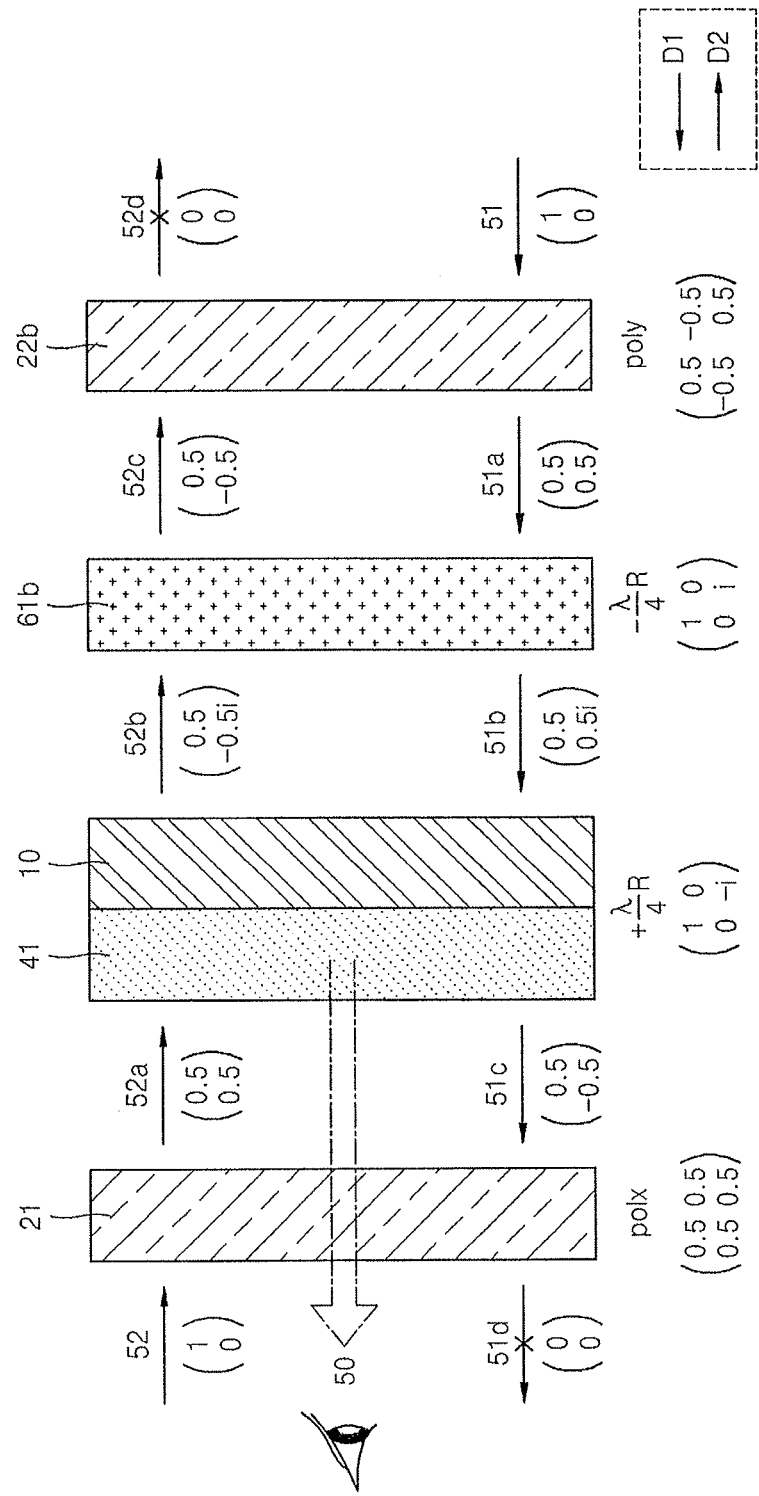

FIGS. 9 and 12 illustrate a black mode, and FIGS. 10 and 11 illustrate a transparent mode. With reference to FIGS. 9 to 12, the Jones Matrix calculation is used to determine the transmissive characteristics of light passing through each optical member. Also, with reference to FIGS. 9 to 12, second external light 52 transmitted in a direction opposite to a direction in which an image is displayed, i.e., front light, and first external light 51 transmitted in the direction in which an image is displayed, i.e., back light, will be sequentially described.

In detail, FIGS. 9 and 10 illustrate cases where a first polarizer 21 and a second polarizer 22 have the same polarizing axis. FIG. 9 illustrates the black mode that does not allow either of the front light and backlight to be transmitted through a display apparatus, and FIG. 10 illustrates the transparent mode that allows about 50% of each of the front light and back light to be transmitted through a display apparatus.

Referring to FIG. 9, first power is supplied to a conversion retarder 61a, and liquid crystal is arranged in the conversion retarder 61a to delay incident light by +¼ wavelength (+λ/4). The first retarder 41 also delays the incident light by +¼ wavelength (+λ/4). Thus, the first retarder 41 and the conversion retarder 61a phase-delay incident light to the same degree and in the same direction. In addition, referring to FIG. 9, the first polarizer 21 and the second polarizer 22a have the same polarizing axis. If a matrix representation is used, then the first retarder 41 and the conversion retarder 61a may be expressed as $$\begin{pmatrix} 1 & 0 \\ 0 & -i \end{pmatrix},$$

and the first polarizer 21 and the second polarizer 22a may be expressed as $$\begin{pmatrix} .5 & .5 \\ .5 & .5 \end{pmatrix}.$$

Whether external light penetrates various combinations of the above optical members will now be described.

Light of an image 50 is emitted from a transparent display device 10 of FIG. 9 in a direction indicated by an arrow D1, so that a user may view the image.

A matrix value of the second external light 52 may be expressed as (Ex=1, Ey=0). The second external light 52 passing through the first polarizer 21 changes into second external light 52a that is linearly polarized. The second external light 52a passing through the first retarder 41 changes into second external light 52b, the phase of which is delayed by +¼ wavelength (+λ/4). The second external light 52b passing through the conversion retarder 61a changes into second external light 52c, the phase of which is delayed by +¼ wavelength (+λ/4). The second external light 52c passing through the second polarizer 22a changes into second external light 52d that is linearly polarized. A matrix value of the finally obtained second external light 52d is (E'x=0, E'y=0). In other words, the second external light 52 is not transmitted through the display device of FIG. 9 in a direction indicated by an arrow D2. This may be expressed in Equation 1 below.

$$\begin{pmatrix} 0 \\ 0 \end{pmatrix} = \begin{pmatrix} .5 & .5 \\ .5 & .5 \end{pmatrix}\begin{pmatrix} 1 & 0 \\ 0 & -i \end{pmatrix}\begin{pmatrix} 1 & 0 \\ 0 & -i \end{pmatrix}\begin{pmatrix} .5 & .5 \\ .5 & .5 \end{pmatrix}\begin{pmatrix} 1 \\ 0 \end{pmatrix} \quad \text{Equation 1}$$

A matrix value of the first external light 51 may be expressed as (Ex=1, Ey=0). The first external light 51 passing through the second polarizer 22a changes into first external light 51a that is linearly polarized. The first external light 51a passing through the conversion retarder 61a changes into first external light 51b, the phase of which is delayed by +¼ wavelength (+λ/4). The first external light 51b passing through the first retarder 41 changes into first external light 51c, the phase of which is delayed by +¼ wavelength (+λ/4). The first external light 51c passing through the first polarizer 21 changes into first external light 51d that is linearly polarized. A matrix value of the finally obtained first external light 51d is (E'x=0, E'y=0). In other words, the first external light 51 is not transmitted through the display device of FIG. 9 in the direction of arrow D1. This may be expressed in Equation 2 below.

$$\begin{pmatrix} 0 \\ 0 \end{pmatrix} = \begin{pmatrix} .5 & .5 \\ .5 & .5 \end{pmatrix}\begin{pmatrix} 1 & 0 \\ 0 & -i \end{pmatrix}\begin{pmatrix} 1 & 0 \\ 0 & -i \end{pmatrix}\begin{pmatrix} .5 & .5 \\ .5 & .5 \end{pmatrix}\begin{pmatrix} 1 \\ 0 \end{pmatrix} \quad \text{Equation 2}$$

In conclusion, referring to FIG. 9, if the first polarizer 21 and the second polarizer 22a have the same polarizing axis and the conversion retarder 61a is controlled to have the same phase-delayed value as the first retarder 41, then the transmissivity of each of the first external light 51 and the second external light 52 passing through the display device is zero. In other words, the black mode of the display apparatus may be easily realized by changing the phase-delayed value of the conversion retarder 61.

FIG. 10 illustrates the transparent mode that allows about 50% of each of the front light and back light to be transmitted through a display apparatus. Referring to FIG. 10, second power is supplied to the conversion retarder 61b, and the liquid crystal is arranged in the conversion retarder 61b to delay light incident thereon by (−¼) wavelength (−λ/4). The first retarder 41 delays the incident light by +¼ wavelength (+λ/4). Thus, the first retarder 41 and the conversion retarder 61b respectively phase-delay incident light by degrees, the absolute values of which are the same but are delayed in different directions. In addition, referring to FIG. 10, the first polarizer 21 and the second polarizer 22a have the same polarizing axis. In conclusion, when a matrix representation is used, the first retarder 41 may be expressed as $$\begin{pmatrix} 1 & 0 \\ 0 & -i \end{pmatrix},$$

the conversion retarder 61b may be expressed as $$\begin{pmatrix} 1 & 0 \\ 0 & i \end{pmatrix},$$

and the first polarizer 21 and the second polarizer 22a may be expressed as $$\begin{pmatrix} .5 & .5 \\ .5 & .5 \end{pmatrix}.$$

Light of an image 50 is emitted from the transparent display device 10 in a direction indicated by an arrow D1 so that a user may view the image.

A matrix value of second external light 52 may be expressed as (Ex=1, Ey=0). The second external light 52 passing through the first polarizer 21 changes into second external light 52a that is linearly polarized. The second external light 52a passing through the first retarder 41 changes into second external light 52b, the phase of which is delayed by +¼ wavelength (+λ/4). The second external light 52b passing through the conversion retarder 61b changes into second external light 52c, the phase of which is delayed by (−¼) wavelength (−λ/4). The second external light 52c passing through the second polarizer 22a changes into second external light 52d that is linearly polarized. A matrix value of the finally obtained second external light 52d is (E'x=0.5, E'y=0.5). In other words, about 50% of the second external light 52 is transmitted through the display apparatus 100 of FIG. 10 in a direction indicated by the arrow D2. This may be expressed as Equation 3 below.

$$\begin{pmatrix} .5 \\ .5 \end{pmatrix} = \begin{pmatrix} .5 & .5 \\ .5 & .5 \end{pmatrix} \begin{pmatrix} 1 & 0 \\ 0 & i \end{pmatrix} \begin{pmatrix} 1 & 0 \\ 0 & -i \end{pmatrix} \begin{pmatrix} .5 & .5 \\ .5 & .5 \end{pmatrix} \begin{pmatrix} 1 \\ 0 \end{pmatrix} \quad \text{Equation 3}$$

A matrix value of first external light 51 may be expressed as (Ex=1, Ey=0). The first external light 51 passing through the second polarizer 22a changes into first external light 51a that is linearly polarized. The first external light 51a passing through the conversion retarder 61b changes into first external light 51b, the phase of which is delayed by (−¼) wavelength (−λ/4). The first external light 51b passing through the first retarder 41 changes into first external light 51c, the phase of which is delayed by +¼ wavelength (+λ/4). The first external light 51c passing through the first polarizer 21 changes into first external light 51d that is linearly polarized, and a matrix value of the finally first external light 51d is (E'x=0.5, E'y=0.5). In other words, about 50% of the first external light 51 is transmitted through the display apparatus of FIG. 10 in the direction of arrow D1. This may be expressed in Equation 4 below.

$$\begin{pmatrix} .5 \\ .5 \end{pmatrix} = \begin{pmatrix} .5 & .5 \\ .5 & .5 \end{pmatrix} \begin{pmatrix} 1 & 0 \\ 0 & -i \end{pmatrix} \begin{pmatrix} 1 & 0 \\ 0 & i \end{pmatrix} \begin{pmatrix} .5 & .5 \\ .5 & .5 \end{pmatrix} \begin{pmatrix} 1 \\ 0 \end{pmatrix} \quad \text{Equation 4}$$

In conclusion, referring to FIG. 10, if the first polarizer 21 and the second polarizer 22a have the same polarizing axis and the conversion retarder 61b is controlled to have a different phase-delayed value from that of the first retarder 41, e.g., same absolute values but in different directions, then the transmissivity of each of the first external light 51 and the second external light 52 passing trough the display device is about 50%. In other words, the transparent mode of the display apparatus may be easily realized by changing the phase-delayed value of the conversion retarder 61b.

FIGS. 11 and 12 illustrate cases where a polarizing axis of the first polarizer 21 is perpendicular to that of a second polarizer 22b.

FIG. 11 illustrates the black mode that does not allow either front light or back light to be transmitted through a display apparatus. In the display apparatus of FIG. 11, the first power is supplied to the conversion retarder 61a, so the liquid crystal is arranged in the conversion retarder 61a to delay light incident thereon by +¼ wavelength (+λ/4). The first retarder 41 delays incident light by +¼ wavelength (+λ/4). Thus, the first retarder 41 and the conversion retarder 61a phase-delay incident light to the same degree and in the same direction. In addition, the first polarizer 21 and the second polarizer 22b in FIG. 11 respectively have polarizing axes that are perpendicular to each other, unlike in FIG. 9. If a matrix representation is used, the first retarder 41 and the conversion retarder 61a may be expressed as $$\begin{pmatrix} 1 & 0 \\ 0 & -i \end{pmatrix},$$

the first polarizer 21 may be expressed as $$\begin{pmatrix} .5 & .5 \\ .5 & .5 \end{pmatrix},$$

and the second polarizer 22b may be expressed as $$\begin{pmatrix} .5 & -.5 \\ -.5 & .5 \end{pmatrix}.$$

Light of an image 50 is emitted from a transparent display device 10 of FIG. 11 in a direction indicated by an arrow D1 so that a user may view the image.

A matrix value of the second light 52 may be expressed as (Ex=1, Ey=0). The second external light 52 passing through the first polarizer 21 changes into second external light 52a that is linearly polarized. The second external light 52a passing through the first retarder 41 changes into second external light 52b, the phase of which is delayed by +¼ wavelength (+λ/4). The second external light 52b passing through the conversion retarder 61a changes into second external light 52c, the phase of which is delayed by +¼ wavelength (+λ/4). The second external light 52c passing through the second polarizer 22b changes into second external light 52d that is linearly polarized. A matrix value of the finally obtained second external light 52d may be expressed as (E'x=0.5, E'y=0.5). In other words, about 50% of the second external light 52 is transmitted through the display apparatus of FIG. 11 in a direction indicated by the arrow D2. This may be expressed in Equation 5 below.

$$\begin{pmatrix} .5 \\ .5 \end{pmatrix} = \begin{pmatrix} .5 & -.5 \\ -.5 & .5 \end{pmatrix} \begin{pmatrix} 1 & 0 \\ 0 & -i \end{pmatrix} \begin{pmatrix} 1 & 0 \\ 0 & -i \end{pmatrix} \begin{pmatrix} .5 & .5 \\ .5 & .5 \end{pmatrix} \begin{pmatrix} 1 \\ 0 \end{pmatrix} \quad \text{Equation 5}$$

A matrix value of first external light 51 may be expressed as (Ex=1, Ey=0). The first external light 51 passing through the second polarizer 22b changes into first external light 51a that is linearly polarized. The first external light 51a passing through the conversion retarder 61a changes into first external light 51b, the phase of which is delayed by +¼ wavelength (+λ/4). The first external light 51b passing through the first retarder 41 changes into first external light 51c, the phase of which is delayed by +¼ wavelength (+λ/4). The first external light 51c passing through the first polarizer 21 changes into first external light 51d that is linearly polarized. A matrix value of the finally obtained first external light 51d may be expressed as (E'x=0.5, E'y=0.5). In other words, about 50% of the first external light 51 is transmitted through in the display apparatus of FIG. 11 in the direction of arrow D1. This may be expressed in Equation 6 below.

$$\begin{pmatrix} .5 \\ .5 \end{pmatrix} = \begin{pmatrix} .5 & .5 \\ .5 & .5 \end{pmatrix} \begin{pmatrix} 1 & 0 \\ 0 & -i \end{pmatrix} \begin{pmatrix} 1 & 0 \\ 0 & -i \end{pmatrix} \begin{pmatrix} .5 & -.5 \\ -.5 & .5 \end{pmatrix} \begin{pmatrix} 1 \\ 0 \end{pmatrix} \quad \text{Equation 6}$$

In conclusion, referring to FIG. 11, if the first polarizer 21 and the second polarizer 22b have different polarizing axes and the conversion retarder 61a is controlled to have the same phase-delayed value as the first retarder 41, then the transmissivity of each of the first external light 51 and the second external light 52 passing through the display apparatus is about 50%. In other words, the transparent mode of the display apparatus may be easily realized by changing the phase-delayed value of the conversion retarder 61. According to the current embodiment, the transmissivity of the display apparatus in the transparent mode is high, e.g., about 50%.

FIG. 12 illustrates the black mode that does not allow either front light or back light to be transmitted through a display apparatus. In the display apparatus of FIG. 12, the second power is supplied to the conversion retarder 61b, so liquid crystal is arranged in the conversion retarder 61a to delay incident light by (−¼) wavelength (−λ/4). The first retarder 41 delays incident light by +¼ wavelength (+λ/4), similar to the first retarder 41 of FIG. 1 described above. Thus, the first retarder 41 and the conversion retarder 61b respectively phase-delay incident light by degrees, the absolute values of which are the same but are delayed in different directions. In addition, referring to FIG. 12, the first polarizer 21 and the second polarizer 22a respectively have polarizing axes perpendicular to each other. If a matrix representation is used, the first retarder 41 may be expressed as $$\begin{pmatrix} 1 & 0 \\ 0 & -i \end{pmatrix},$$

the conversion retarder 61b may be expressed as $$\begin{pmatrix} 1 & 0 \\ 0 & i \end{pmatrix},$$

the first polarizer 21 may be expressed as $$\begin{pmatrix} .5 & -.5 \\ -.5 & .5 \end{pmatrix},$$

and the second polarizer 22a may be expressed as $$\begin{pmatrix} .5 & .5 \\ .5 & .5 \end{pmatrix}.$$

Light of an image 50 is emitted from the transparent display device 10 in the direction of arrow D1 so that a user may view the image.

A matrix value of second external light 52 may be expressed as (Ex=1, Ey=0). The second external light 52 passing through the first polarizer 21 changes into second external light 52a that is linearly polarized. The second external light 52a passing through the first retarder 41 changes into second external light 52b, the phase of which is delayed by +¼ wavelength (+λ/4). The second external light 52b passing through the conversion retarder 61b changes into second external light 52c, the phase of which is delayed by (−¼) wavelength (−λ/4). The second external light 52c passing through the second polarizer 22b changes into second external light 52d that is linearly polarized. A matrix value of the finally obtained second external light 52d is (E'x=0, E'y=0). In other words, the second external light 52 is not transmitted through the display apparatus 100 of FIG. 12 in a direction indicated by an arrow D2. This may be expressed in Equation 7 below.

$$\begin{pmatrix} 0 \\ 0 \end{pmatrix} = \begin{pmatrix} .5 & -.5 \\ -.5 & .5 \end{pmatrix} \begin{pmatrix} 1 & 0 \\ 0 & i \end{pmatrix} \begin{pmatrix} 1 & 0 \\ 0 & -i \end{pmatrix} \begin{pmatrix} .5 & .5 \\ .5 & .5 \end{pmatrix} \begin{pmatrix} 1 \\ 0 \end{pmatrix} \quad \text{Equation 7}$$

A matrix value of the first external light 51 may be expressed as (Ex=1, Ey=0). The first external light 51 passing through the second polarizer 22b changes into first external light 51a that is linearly polarized. The first external light 51a passing through the conversion retarder 61b changes into first external light 51b, the phase of which is delayed by (−¼) wavelength (−λ/4). The first external light 51b passing through the first retarder 41 changes into first external light 51c, the phase of which is delayed by +¼ wavelength (+λ/4). The first external light 51c passing through the first polarizer 21 changes into first external light 51d that is linearly polarized, and a matrix value of the finally first external light 51d is (E'x=0, E'y=0). In other words, the first external light 51 is not transmitted through the display apparatus of FIG. 12 in the direction of arrow D1. This may be expressed in Equation 8 below.

$$\begin{pmatrix} 0 \\ 0 \end{pmatrix} = \begin{pmatrix} .5 & .5 \\ .5 & .5 \end{pmatrix} \begin{pmatrix} 1 & 0 \\ 0 & -i \end{pmatrix} \begin{pmatrix} 1 & 0 \\ 0 & i \end{pmatrix} \begin{pmatrix} .5 & -.5 \\ -.5 & .5 \end{pmatrix} \begin{pmatrix} 1 \\ 0 \end{pmatrix} \quad \text{Equation 8}$$

In conclusion, referring to FIG. 12, if the first polarizer 21 and the second polarizer 22b have different polarizing axes and the conversion retarder 61b is controlled to have a different phase-delayed value from that of the first retarder 41, then the transmissivitiy of each of the first external light 51 and the second external light 52 passing trough the display device is zero. In other words, the black mode of the display apparatus may be easily realized by changing the phase-delayed value of the conversion retarder 61.

According to example embodiments, the transmissivity of external light through a display apparatus may be controlled by using optical members, such as a polarizer and a retarder, which may operate with no power or a small amount of power and do not lower the transmissivity of external light, instead of a high-power consuming device, such as a shutter, which greatly lowers the transmissivity of external light. That is, the phase of light and a direction in which the light is polarized may be changed by using a combination of the optical members.

Figure 13:
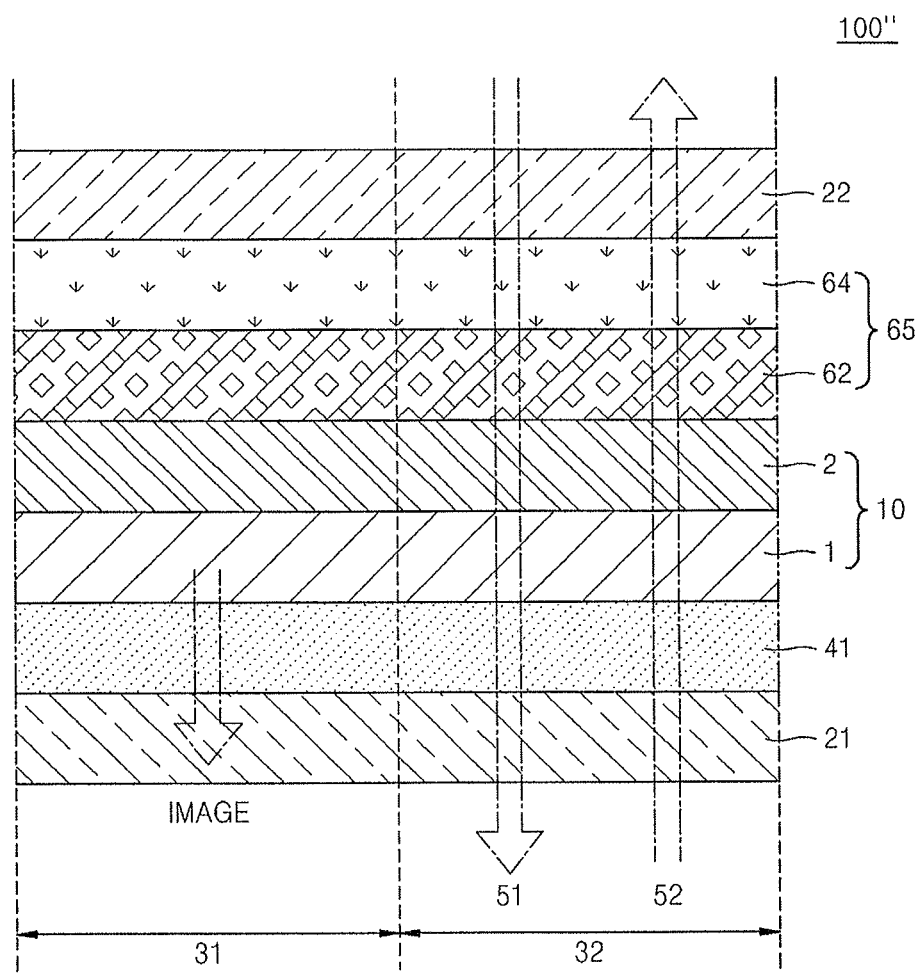
FIG. 13 illustrates a schematic cross-sectional view of a display apparatus according to another embodiment.

FIG. 13 is a schematic cross-sectional view of a display apparatus 100" according to another embodiment. Referring to FIG. 13, the first polarizer 21, the first retarder 41, the transparent display device 10, a converter 65, and the second polarizer 22 may be disposed in the display apparatus 100", similar to the display apparatus 100 of FIG. 1. The converter 65 is a switchable retarder corresponding to the conversion retarder 61 of FIG. 1 or 5. The converter 65 may include a second retarder 62 and a liquid crystal layer 64. The second retarder 62 may be disposed between the transparent display device 10 and the liquid crystal layer 64, and the liquid crystal layer 64 may be disposed between the second retarder 62 and the second polarizer 22. A liquid crystal layer of the liquid crystal layer 64, e.g., that is generally used in a liquid crystal monitor, is inexpensive and is easy to obtain. The liquid crystal layer 64 may be a switchable retarder that delays incident light by 0 degrees or +½ wavelength (+λ/2) or by (−½) wavelength (−λ/2) or 0 degrees. The second retarder 62 may delay incident light by +¼ wavelength (+λ/4) or by (−¼) wavelength (−λ/4). The other elements illustrated in FIG. 13 correspond to those illustrated in FIG. 1 or 5 and thus are not described again here.

The converter 65 may be a switchable retarder that phase-delays incident light within a range from (−¼) wavelength (−λ/4) to +¼ wavelength (+λ/4) by using a combination of the liquid crystal layer 64 and the second retarder 62, like the conversion retarder 61 of FIG. 1 or 5.

For example, a case where the second retarder 62 is a switchable retarder that delays incident light by (−¼) wavelength (−λ/4) and the liquid crystal layer 64 delays the incident light by 0 degrees or +½ wavelength (+λ/2) will be described. In this case, a phase-delayed value of the converter 65 that is a combination of the second retarder 62 and the liquid crystal layer 64 may be (−λ/4)+(0)=(−λ/4) or (−λ/4)+(+λ/2)=(+λ/4). That is, the phase-delayed value of the converter 65 may be equal to that of the conversion retarder 61 of FIG. 1 or 5. In other words, the converter 65 may be used instead of the conversion retarder 61.

As another example, a case where the second retarder 62 is a switchable retarder that delays incident light by +¼ wavelength (+λ/4) and the liquid crystal layer 64 delays the incident light by (−½) wavelength (−λ/2) or 0 degrees will be described. In this case, a phase-delayed value of the converter 65 that is a combination of the second retarder 62 and the liquid crystal layer 64 may be (+λ/4)+(λ/2)=(−λ/4) or (+λ/4)+(0)=(+λ/4). In other words, the phase-delayed value of the converter 65 is equal to that of the conversion retarder 61 of FIG. 1 or 5. Therefore, the converter 65 may be used instead of the conversion retarder 61.

According to example embodiments, the display apparatus 100" that controls the transmissivity of external light therethrough according to a mode may be manufactured by using a simple combination of optical members, such as a retarder and a liquid crystal layer, instead of the conversion retarder 61. In the display apparatus 100" of FIG. 13, the transparent mode and the black mode may be realized in a similar manner to the ways described above with reference to FIGS. 9 and 10, according to a voltage applied to the liquid crystal layer 64, and by using a combination of the first polarizer 21 and the second polarizer 22, when the first polarizer 21 and the second polarizer 22 have the same polarizing axis.

Although not shown in FIG. 13, the embodiments of FIGS. 9 to 12 may be also performed when the transparent display device 10 is a top emission type display device like in FIG. 5 or when the transparent display device 10 is a bottom emission type display device.

In the claims set forth herein, a first phase may be (+λ/4), a second phase may be (−λ/4) or (+λ3/4), a third phase may be 0 degrees, a fourth phase may be (+λ/2), a fifth phase may be (−λ/2), and a sixth phase may be 0 degrees. Otherwise, the first phase may be 90 degrees, the second phase may be (−90) degrees or 270 degrees, the third and sixth phases may be 0 degrees or 360 degrees, and the fourth and fifth phases may be 180 degrees. However, the example embodiments are not limited thereto.

According to the above embodiments, optical members may be disposed in a transparent display device, and the transmissivity of external light through the transparent display device may be controlled according to a mode with a small amount of power.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the example embodiments as set forth in the following claims.

What is claimed is:

1. A display apparatus for controlling optical transmissivity, the display apparatus comprising:
   a transparent display device, the device having a pixel region for emitting light and a transmissive region adjacent to the pixel region for transmitting external light therethrough;
   a first polarizer on a first surface of the transparent display device;
   a first retarder between the first polarizer and the first surface of the transparent display device;
   a second polarizer on a second surface of the transparent display device, the first and second surfaces of the transparent display device being opposite to each other; and
   a conversion retarder between the second polarizer and the second surface of the transparent display device,
   wherein the transparent display device comprises:
      a pixel circuit unit in the pixel region and including at least one thin-film transistor (TFT),
      a first insulating layer covering at least the pixel circuit unit,
      a first electrode on the first insulating layer to be electrically connected to the pixel circuit unit, the first electrode being located in the pixel region,
      a second electrode in at least the pixel region and facing the first electrode, and
      an organic layer between the first electrode and the second electrode, the organic layer including an emission layer, wherein the first polarizer linearly polarizes an incident light from an exterior or from the first retarder to transmit a first linearly polarized light therethrough, wherein the first retarder delays a phase of an incident light from the first polarizer or from the conversion retarder to transmit a first wavelength-delayed light therethrough, wherein the second polarizer linearly polarizes an incident light from exterior or from the conversion retarder to transmit a second linearly polarized light therethough, and wherein the conversion retarder delays a wavelength of an incident light from the first retarder or from the second polarizer within a range from a first phase to a second phase depending on power supplied to the conversion retarder to transmit a second wavelength-delayed light therethrough.

2. The display apparatus of claim 1, wherein the first polarizer and the second polarizer have the same polarizing axis.

3. The display apparatus of claim 2, wherein the first retarder delays the wavelength of the incident light by the first phase.

4. The display apparatus of claim 3, wherein the conversion retarder delays the wavelength of the incident light by the first phase in accordance with the power supplied thereto, the first and second phases having a same absolute value but different directions, and the display apparatus blocks transmittance of the incident light therethrough.

5. The display apparatus of claim 3, wherein the conversion retarder delays the wavelength of the incident light by the second phase in accordance with the power supplied thereto, the first and second phases having a same absolute value but different directions, and the display apparatus transmits the incident light therethrough.

6. The display apparatus of claim 1, wherein the first polarizer and the second polarizer have polarizing axes that are perpendicular to each other.

7. The display apparatus of claim 6, wherein the first retarder delays the wavelength of the incident light by the first phase.

8. The display apparatus of claim 7, wherein the conversion retarder delays the wavelength of the incident light by the first phase in accordance with the power supplied thereto, the first and second phases having a same absolute value but different directions, and the display apparatus transmits the incident light therethrough.

9. The display apparatus of claim 7, wherein the conversion retarder delays the wavelength of the incident light by the second phase in accordance with the power supplied thereto, the first and second phases having a same absolute value but different directions, and the display apparatus blocks transmittance of the incident light therethrough.

10. The display apparatus of claim 1, wherein the conversion retarder includes a second retarder and a liquid crystal layer, the second retarder being between the transparent display device and the liquid crystal layer, the liquid crystal layer being between the second retarder and the second polarizer, and the liquid crystal layer delays the wavelength of the incident light within the predetermined range in accordance with voltage applied thereto.

11. The display apparatus of claim 10, wherein the first polarizer and the second polarizer have the same polarizing axis, and the first retarder delays the wavelength of the incident light by the first phase.

12. The display apparatus of claim 11, wherein:
the second retarder delays the wavelength of the incident light by the second phase,
the liquid crystal delays the wavelength of the incident light within a range from a third phase to a fourth phase when voltage is applied to the liquid crystal layer, and
a sum of the third phase and the fourth phase is equal to the fourth phase, a sum of the fourth phase and the second phase is equal to the first phase, and the first phase and the second phase having a same absolute value but different directions.

13. The display apparatus of claim 11, wherein:
the second retarder delays the wavelength of the incident light by the first phase,
the liquid crystal layer delays the wavelength of the incident light within a range from a fifth phase to a sixth phase when voltage is applied to the liquid crystal layer, and
a sum of the fifth phase and the first phase is equal to the second phase, a sum of the sixth phase and the first phase is equal to the first phase, and the first phase and the second phase have a same absolute value but different directions.

14. The display apparatus of claim 10, wherein the first polarizer and the second polarizer have polarizing axes perpendicular to each other, and the first retarder delays the wavelength of the incident light by the first phase.

15. The display apparatus of claim 14, wherein:
the second retarder delays the wavelength of the incident light by the second phase,
the liquid crystal layer delays the wavelength of the incident light within a range from a third phase to a fourth phase when voltage is applied to the liquid crystal layer, and
a sum of the third phase and the fourth phase is equal to the fourth phase, the sum of the fourth phase and the second phase is equal to the first phase, and the first phase and the second phase have a same absolute value but different directions.

16. The display apparatus of claim 14, wherein:
the second retarder delays the wavelength of the incident light by the first phase,
the liquid crystal layer delays the wavelength of the incident light within a range from a fifth phase to a sixth phase when voltage is applied to the liquid crystal layer, and
a sum of the fifth phase and the first phase is equal to the second phase, the sum of the sixth phase and the first phase is equal to the first phase, and the first phase and the second phase have a same absolute value but different directions.

17. The display apparatus of claim 1, wherein the conversion retarder is a switchable retarder having at least two different phase states.

18. The display apparatus of claim 1, wherein the first retarder and the conversion retarder include different materials.

19. The display apparatus of claim 18, wherein the conversion retarder includes liquid crystals.

20. The display apparatus of claim 1, wherein the thin-film transistor comprises a semiconductor active layer formed of a semiconductor oxide.

21. The display apparatus of claim 1, wherein the first electrode comprises a reflective layer.

* * * * *